(12) United States Patent
Ito et al.

(10) Patent No.: US 11,332,597 B2
(45) Date of Patent: May 17, 2022

(54) PHOTO-CURABLE COMPOSITION AND PATTERNING METHOD USING THE SAME

(71) Applicant: CANON KABUSHIKI KAISHA, Tokyo (JP)

(72) Inventors: Toshiki Ito, Kawasaki (JP); Chieko Mihara, Isehara (JP); Kanae Kawahata, Kawasaki (JP); Motoki Okinaka, Inagi (JP); Youji Kawasaki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/719,647

(22) Filed: Dec. 18, 2019

(65) Prior Publication Data

US 2020/0123343 A1 Apr. 23, 2020

Related U.S. Application Data

(62) Division of application No. 14/357,542, filed as application No. PCT/JP2012/078082 on Oct. 24, 2012, now abandoned.

(30) Foreign Application Priority Data

Nov. 10, 2011 (JP) .................................. 2011-246714

(51) Int. Cl.
| | |
|---|---|
| *C08K 5/06* | (2006.01) |
| *H05K 3/00* | (2006.01) |
| *B05D 3/12* | (2006.01) |
| *B05D 3/06* | (2006.01) |
| *G03F 7/031* | (2006.01) |
| *G03F 7/038* | (2006.01) |
| *B82Y 10/00* | (2011.01) |

(Continued)

(52) U.S. Cl.
CPC ............... *C08K 5/06* (2013.01); *B05D 3/067* (2013.01); *B05D 3/12* (2013.01); *B82Y 10/00* (2013.01); *B82Y 40/00* (2013.01); *C08F 2/24* (2013.01); *C08F 2/48* (2013.01); *G03F 7/0002* (2013.01); *G03F 7/0046* (2013.01); *G03F 7/0048* (2013.01); *G03F 7/027* (2013.01); *G03F 7/031* (2013.01); *G03F 7/038* (2013.01); *H05K 3/0014* (2013.01); *H05K 3/0017* (2013.01); *Y10T 428/24802* (2015.01)

(58) Field of Classification Search
CPC ..................................................... G03F 7/0002
See application file for complete search history.

(56) References Cited

U.S. PATENT DOCUMENTS

| | | | | |
|---|---|---|---|---|
| 2007/0272825 | A1* | 11/2007 | Xu ......................... | G03F 7/0002 |
| | | | | 249/115 |
| 2010/0112236 | A1* | 5/2010 | Fletcher ................. | B82Y 10/00 |
| | | | | 427/569 |

FOREIGN PATENT DOCUMENTS

JP          2010206189 A  *  9/2010  ............ C08F 220/28

OTHER PUBLICATIONS

Machine translation of Fujie et al., JP2010206189 (Year: 2010).*

* cited by examiner

*Primary Examiner* — Ian A Rummel
(74) *Attorney, Agent, or Firm* — Canon U.S.A., Inc. IP Division

(57) ABSTRACT

The present invention provides a photo-curable composition, and UV imprint method, that requires a small demolding force, wherein the photo-curable composition contains a polymerizable monomer (A), a polymerization initiator (B), and a fluorine-containing surfactant (C), and the photo-cured (Continued)

product of the photo-curable composition has a water contact angle of 74 degrees or less.

16 Claims, 1 Drawing Sheet

(51) Int. Cl.
*B82Y 40/00* (2011.01)
*G03F 7/004* (2006.01)
*G03F 7/00* (2006.01)
*G03F 7/027* (2006.01)
*C08F 2/24* (2006.01)
*C08F 2/48* (2006.01)

PHOTO-CURABLE COMPOSITION AND PATTERNING METHOD USING THE SAME

This Application is a Divisional of pending U.S. patent application Ser. No. 14/357,542, filed May 9, 2014, which is a National Stage Entry of PCT/JP2012/078082, filed Oct. 24, 2012, which claims priority to Japanese Patent Application No. 2011-246714, filed Nov. 10, 2011, each of which is hereby incorporated by reference in its entirety.

TECHNICAL FIELD

The present invention relates to a photo-curable composition and a patterning method using the photo-curable composition.

BACKGROUND ART

A UV nanoimprint method is a patterning method of pressing a mold having a fine textured pattern on its surface against a substrate coated with a resist (photo-curable composition) to transfer the textured pattern to the resist film on the substrate.

It is important in the UV nanoimprint method to decrease the force with which the mold is released from cured resist, that is, demolding force. This is because a large demolding force may cause defects in the pattern or may cause the substrate to rise from the stage, resulting in low alignment precision.

A known photo-curable composition for use in photo-nanoimprint contains at least one polymerizable monomer, a polymerization initiator, and a fluorinated surfactant. (PTL 1)

PTL 1 also discloses the use of a fluorinated surfactant in which a perfluoroalkyl chain is bonded to a hydrocarbon chain or a fluorinated surfactant in which a perfluoroalkyl chain is bonded to an ethoxy chain, a methoxy chain, or siloxane.

PTL 2 discloses that the resulting photo-cured film is water-repellent and preferably has a water contact angle in the range of 75 to 98 degrees.

CITATION LIST

Patent Literature

PTL 1 Japanese Patent Laid-Open No. 2007-084625
PTL 2 International Publication WO 2006/114958

SUMMARY OF INVENTION

Technical Problem

As described above, it is known that a fluorinated material may be added to a composition to impart water repellency to a surface of a photo-cured film and decrease demolding force. However, the addition of a known fluorinated material alone does not necessarily provide an interface between a mold surface and a photo-cured film surface that contributes to a decreased demolding force, and still results in a large demolding force.

In view of such problems associated with the related art, the present invention provides a photo-curable composition that requires a small demolding force in a patterning method. The present invention also provides a patterning method that requires a small demolding force.

Solution to Problem

In order to solve the problems described above, a photo-curable composition according to one aspect of the present invention contains a polymerizable monomer (A), a polymerization initiator (B), and a fluorine-containing surfactant (C), wherein a photo-cured product of the composition has a water contact angle of 74 degrees or less.

A patterning method according to one aspect of the present invention includes placing the photo-curable composition on a substrate to be processed, bringing the photo-curable composition into contact with a mold, irradiating the photo-curable composition with light, and releasing the photo-curable composition from the mold after the irradiation.

Advantageous Effects of Invention

The present invention provides a photo-curable composition that requires a small demolding force. The present invention also provides a patterning method that requires a small demolding force.

DESCRIPTION OF EMBODIMENTS

Figure 1A:
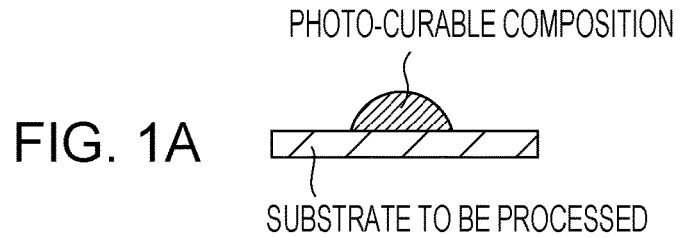
FIGS. 1A to 1F are cross-sectional views illustrating a patterning method.

The present invention will be further described in the following embodiments. The present invention is not limited to these embodiments. It will be recognized by those skilled in the art that variations and modifications may be made to these embodiments without departing from the gist of the present invention. These variations and modifications are also intended to be within the scope of the present invention.

The term "patterning method", as used herein, includes a UV imprint method. The UV imprint method is preferably defined as a method for forming a pattern having a size in the range of 1 nm to 10 mm, more preferably approximately 10 nm to 100 μm. A technique of forming a nanoscale (1 to 100 nm) pattern (textured structure) is generally referred to as photo-nanoimprint. The present invention includes photo-nanoimprint.

A photo-curable composition according to an embodiment of the present invention contains a polymerizable monomer (A), a polymerization initiator (B), and a fluorine-containing surfactant (C). The photo-curable composition may contain another additive component.

The fluorine-containing surfactant (C) may have a polar functional group at one end.

The amount of fluorine-containing surfactant (C) is controlled such that a photo-cured product of a photo-curable composition according to an embodiment of the present invention has a water contact angle of 74 degrees or less.

As disclosed in PTL 2, it has hitherto been preferable that a photo-cured film is water-repellent and has a high water contact angle in the range of 75 to 98 degrees.

As a result of extensive studies, the present inventors found that a photo-curable composition requires a small demolding force when its photo-cured product has a water contact angle of 74 degrees or less.

Although there is no clear reason that a composition according to an embodiment of the present invention requires a small demolding force when the contact angle is 74 degrees or less, it is surmised that the fluorine-containing surfactant (C) segregates on a surface of the photo-cured product, and a terminal functional group of the surfactant imparts hydrophilicity to the photo-cured product. When the functional group is attached to a mold surface, a thin film of the fluorine-containing surfactant (C) may be formed at the interface between the mold and the resist and thereby decreases demolding force. In particular, when the terminal functional group has a high polarity, this probably facilitates the formation of a polar bond with the mold surface and the formation of the thin film.

Furthermore, when the fluorine-containing surfactant (C) has a perfluoroalkyl chain (C-a) on one end and a polar functional group (C-c) on the other end, and the perfluoroalkyl chain is linked to the polar functional group through a poly(alkylene oxide) chain (C-b1) and/or an alkyl chain (C-b2), it is surmised that the polar functional group (C-c) forms a polar bond with the mold surface, and a thin film of the fluorine-containing surfactant (C) formed at the interface between the mold and the resist can decrease demolding force.

Specific examples of the perfluoroalkyl chain (C-a) include, but are not limited to, fluorine-substituted linear alkyl groups having 1 to 20 carbon atoms, such as a perfluoromethyl group, a perfluoroethyl group, a perfluoropropyl group, a perfluorobutyl group, a perfluoropentyl group, a perfluorohexyl group, a perfluoroheptyl group, a perfluorooctyl group, a perfluorononyl group, and a perfluorodecyl group. From the environmental safety point of view, the number of carbon atoms may be seven or less.

Specific examples of the polar functional group (C-c) include, but are not limited to, alkylhydroxy groups, a carboxy group, a thiol group, an amino group, a pyridyl group, a silanol group, and a sulfo group.

Specific examples of the poly(alkylene oxide) chain (C-b1) include, but are not limited to, polyethylene oxide) chains having a repeating unit number in the range of 1 to 100 and poly(propylene oxide) chains having a repeating unit number in the range of 1 to 100.

Specific examples of the alkyl chain (C-b2) include, but are not limited to, alkyl groups having 1 to 100 carbon atoms and a linear or ring structure.

The (C-a) and the (C-b1), the (C-a) and the (C-b2), the (C-b1) and the (C-c), or the (C-b2) and the (C-c) may be linked through a divalent linking group. Specific examples of the divalent linking group include, but are not limited to, alkylene groups, a phenylene group, a naphthylene group, ester groups, ether groups, thioether groups, a sulfonyl group, a secondary amino group, a tertiary amino group, an amide group, and a urethane group.

The fluorine-containing surfactant (C) may be at least one compound having the following general formula (1):

[Chem. 1]

$$F(CF_2)_6(CH_2)_m(OCH_2CH_2)_nOH \quad (1)$$

wherein m is an integer in the range of 1 to 3, and n is an integer in the range of 1 to 100.

The fluorine-containing surfactant (C) may be used alone or in combination.

The fluorine-containing surfactant (C) may constitute 0.001% by weight to 5% by weight, preferably 0.002% by weight to 4% by weight, more preferably 0.005% by weight to 3% by weight, of the amount of polymerizable monomer (A). As described above, the amount of fluorine-containing surfactant (C) is controlled such that a photo-cured product of a photo-curable composition according to an embodiment of the present invention has a water contact angle of 74 degrees or less.

The photo-cured product may have a water contact angle of 74 degrees or less and 1 degree or more, preferably 10 degrees or more.

In particular, the photo-cured product may have a water contact angle of 70 degrees or less, or 71 degrees or more and 74 degrees or less.

Measurement of Water Contact Angle

A method for measuring the water contact angle of a photo-cured product according to the present invention will be described below.

A photo-cured product may be prepared by applying a photo-curable composition according to an embodiment of the present invention to a substrate by coating, such as spin coating, and irradiating the photo-curable composition with light in an inert atmosphere, such as a nitrogen gas atmosphere, to form a photo-cured film.

The water contact angle may be measured with a commercially available contact angle meter, such as a fully-automatic contact angle meter CA-W (manufactured by Kyowa Interface Science Co., Ltd.).

The water contact angle of a photo-cured film in the present invention is defined as the angle between a surface of the photo-cured film and a tangent line at the intersection of 1 μl of pure water on the photo-cured film and the photo-cured film. The water contact angle may be the mean value of a plurality of measurements at different positions on a sample.

Polymerizable Monomer (A)

The polymerizable monomer of a photo-curable composition according to an embodiment of the present invention may be a radical-polymerizable monomer or a cation-polymerizable monomer.

The radical-polymerizable monomer may be a compound having at least one acryloyl or methacryloyl group. The cation-polymerizable monomer may be a compound having at least one vinyl ether group, epoxy group, or oxetanyl group.

Polymerizable Monomer (A): Radical-Polymerizable Component

Examples of a monofunctional (meth)acryl compound having one acryloyl or methacryloyl group include, but are not limited to, phenoxyethyl (meth)acrylate, phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, EO-modified p-cumylphenol (meth)acrylate, 2-bromophenoxyethyl (meth)acrylate, 2,4-dibromophenoxyethyl (meth)acrylate, 2,4,6-tribromophenoxyethyl (meth)acrylate, EO-modified phenoxy (meth)acrylate, PO-modified phenoxy (meth)acrylate, polyoxyethylene nonylphenyl ether (meth)acrylate, isobornyl (meth)acrylate, 1-adamantyl (meth)acrylate, 2-methyl-2-adamantyl (meth)acrylate, 2-ethyl-2-adamantyl (meth)acrylate, bornyl (meth)acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloylmorpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, isoamyl (meth)acrylate, hexyl (meth)acrylate, heptyl (meth)acrylate, octyl (meth)

acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth) acrylate, lauryl (meth)acrylate, stearyl (meth)acrylate, isostearyl (meth)acrylate, benzyl (meth)acrylate, tetrahydrofurfuryl (meth)acrylate, butoxyethyl (meth)acrylate, ethoxydiethylene glycol (meth)acrylate, poly(ethylene glycol) mono(meth)acrylate, poly(propylene glycol) mono (meth)acrylate, methoxyethylene glycol (meth)acrylate, ethoxyethyl (meth)acrylate, methoxy poly(ethylene glycol) (meth)acrylate, methoxy poly(propylene glycol) (meth) acrylate, diacetone(meth)acrylamide, isobutoxymethyl (meth)acrylamide, N,N-dimethyl(meth)acrylamide, t-octyl (meth)acrylamide, dimethylaminoethyl (meth)acrylate, diethylaminoethyl (meth)acrylate, 7-amino-3,7-dimethyloctyl (meth)acrylate, N,N-diethyl(meth)acrylamide, and N,N-dimethylaminopropyl(meth)acrylamide.

The monofunctional (meth)acryl compound may be, but is not limited to, the following product: Aronix M101, M102, M110, M111, M113, M117, M5700, TO-1317, M120, M150, or M156 (manufactured by Toagosei Co., Ltd.), MEDOL 10, MIBDOL 10, CHDOL 10, MMDOL 30, MEDOL 30, MIBDOL 30, CHDOL 30, LA, IBXA, 2-MTA, HPA, or Viscoat #150, #155, #158, #190, #192, #193, #220, #2000, #2100, or #2150 (manufactured by Osaka Organic Chemical Industry Ltd.), Light Acrylate BO-A, EC-A, DMP-A, THF-A, HOP-A, HOA-MPE, HOA-MPL, PO-A, P-200A, NP-4EA, or NP-8EA, or epoxy ester M-600A (manufactured by Kyoeisha Chemical Co., Ltd.), Kayarad TC110S, R-564, or R-128H (manufactured by Nippon Kayaku Co., Ltd.), NK ester AMP-10G or AMP-20G (manufactured by Shin Nakamura Chemical Co., Ltd.), FA-511A, 512A, or 513A (manufactured by Hitachi Chemical Co., Ltd.), PHE, CEA, PHE-2, PHE-4, BR-31, BR-31M, or BR-32 (manufactured by Dai-ichi Kogyo Seiyaku Co., Ltd.), VP (manufactured by BASF), or ACMO, DMAA, or DMAPAA (manufactured by Kohjin Co., Ltd.).

Examples of a polyfunctional (meth)acryl compound having at least two acryloyl or methacryloyl groups include, but are not limited to, trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, pentaerythritol tri(meth)acrylate, pentaerythritol tetra(meth)acrylate, ethylene glycol di(meth) acrylate, tetra(ethylene glycol) di(meth)acrylate, polyethylene glycol) di(meth)acrylate, poly(propylene glycol) di(meth)acrylate, 1,4-butanediol di(meth)acrylate, 1,6-hexanediol di(meth)acrylate, neopentyl glycol di(meth)acrylate, tris(2-hydroxyethyl)isocyanurate tri(meth)acrylate, tris (acryloyloxy)isocyanurate, bis(hydroxymethyl) tricyclodecane di(meth)acrylate, dipentaerythritol penta (meth)acrylate, dipentaerythritol hexa(meth)acrylate, EO-modified 2,2-bis(4-((meth)acryloxy)phenyl)propane, PO-modified 2,2-bis(4-((meth)acryloxy)phenyl)propane, and EO,PO-modified 2,2-bis(4-((meth)acryloxy)phenyl) propane.

The polyfunctional (meth)acryl compound may be, but is not limited to, the following product: Yupimer UV SA1002 or SA2007 (manufactured by Mitsubishi Chemical Corp.), Viscoat #195, #230, #215, #260, #335HP, #295, #300, #360, #700, GPT, or 3PA (manufactured by Osaka Organic Chemical Industry Ltd.), Light Acrylate 4EG-A, 9EG-A, NP-A, DCP-A, BP-4EA, BP-4PA, TMP-A, PE-3A, PE-4A, or DPE-6A (manufactured by Kyoeisha Chemical Co., Ltd.), Kayarad PET-30, TMPTA, R-604, DPHA, DPCA-20, -30, -60, or -120, HX-620, D-310, or D-330 (manufactured by Nippon Kayaku Co., Ltd.), Aronix M208, M210, M215, M220, M240, M305, M309, M310, M315, M325, or M400 (manufactured by Toagosei Co., Ltd.), or Ripoxy VR-77, VR-60, or VR-90 (manufactured by Showa Highpolymer Co., Ltd.).

These radical-polymerizable monomers may be used alone or in combination. The term "(meth)acrylate", as used herein, refers to an acrylate and its corresponding methacrylate. The term "(meth)acryloyl group", as used herein, refers to an acryloyl group and its corresponding methacryloyl group. EO denotes ethylene oxide, and an EO-modified compound has a block structure of an ethylene oxide group. PO denotes propylene oxide, and a PO-modified compound has a block structure of a propylene oxide group.

Polymerizable Monomer (A): Cation-Polymerizable Component

Examples of a compound having one vinyl ether group include, but are not limited to, methyl vinyl ether, ethyl vinyl ether, propyl vinyl ether, n-butyl vinyl ether, t-butyl vinyl ether, 2-ethylhexyl vinyl ether, n-nonyl vinyl ether, lauryl vinyl ether, cyclohexyl vinyl ether, cyclohexylmethyl vinyl ether, 4-methylcyclohexylmethyl vinyl ether, benzyl vinyl ether, dicyclopentenyl vinyl ether, 2-dicyclopentenoxyethyl vinyl ether, methoxyethyl vinyl ether, ethoxyethyl vinyl ether, butoxyethyl vinyl ether, methoxyethoxyethyl vinyl ether, ethoxyethoxyethyl vinyl ether, methoxy poly(ethylene glycol) vinyl ether, tetrahydrofurfuryl vinyl ether, 2-hydroxyethyl vinyl ether, 2-hydroxypropyl vinyl ether, 4-hydroxybutyl vinyl ether, 4-hydroxymethylcyclohexylmethyl vinyl ether, diethylene glycol monovinyl ether, poly(ethylene glycol) vinyl ether, chloroethyl vinyl ether, chlorobutyl vinyl ether, chloroethoxyethyl vinyl ether, phenylethyl vinyl ether, and phenoxy poly(ethylene glycol) vinyl ether.

Examples of a compound having at least two vinyl ether groups include, but are not limited to, divinyl ethers, such as ethylene glycol divinyl ether, diethylene glycol divinyl ether, polyethylene glycol) divinyl ether, propylene glycol divinyl ether, butylene glycol divinyl ether, hexanediol divinyl ether, bisphenol A alkylene oxide divinyl ethers, and bisphenol F alkylene oxide divinyl ethers; and polyfunctional vinyl ethers, such as trimethylolethane trivinyl ether, trimethylolpropane trivinyl ether, ditrimethylolpropane tetravinyl ether, glycerin trivinyl ether, pentaerythritol tetravinyl ether, dipentaerythritol pentavinyl ether, dipentaerythritol hexavinyl ether, ethylene oxide adducts of trimethylolpropane trivinyl ether, propylene oxide adducts of trimethylolpropane trivinyl ether, ethylene oxide adducts of ditrimethylolpropane tetravinyl ether, propylene oxide adducts of ditrimethylolpropane tetravinyl ether, ethylene oxide adducts of pentaerythritol tetravinyl ether, propylene oxide adducts of pentaerythritol tetravinyl ether, ethylene oxide adducts of dipentaerythritol hexavinyl ether, and propylene oxide adducts of dipentaerythritol hexavinyl ether.

Examples of a compound having one epoxy group include, but are not limited to, phenyl glycidyl ether, p-tert-butylphenyl glycidyl ether, butyl glycidyl ether, 2-ethylhexyl glycidyl ether, allyl glycidyl ether, 1,2-butylene oxide, 1,3-butadiene monoxide, 1,2-epoxidedecane, epichlorohydrin, 1,2-epoxydecane, styrene oxide, cyclohexene oxide, 3-methacryloyloxymethylcyclohexene oxide, 3-acryloyloxymethylcyclohexene oxide, and 3-vinylcyclohexene oxide.

Examples of a compound having at least two epoxy groups include, but are not limited to, bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolak resin, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexane carboxylate, 2-(3,4-epoxycyclohexyl-5,5-spiro-3,4-epoxy)cyclohexane-meta-dioxane, bis(3,4-epoxycyclohexylmethyl) adipate, vinylcyclohexene oxide, 4-vinylepoxycyclohexane, bis(3,4-epoxy-6-methylcyclohexylmethyl) adipate, 3,4-epoxy-6-methylcyclohexyl-3',4'-epoxy-6'-methylcyclohexane carboxylate, methylene bis(3,4-epoxycyclohexane), dicyclopentadiene diepoxide, ethylene glycol di(3,4-epoxycyclohexylmethyl) ether, ethylene bis(3,4-epoxycyclohexane carboxylate), epoxyhexahydrodioctyl phthalate, epoxyhexahydrodi-2-ethylhexyl phthalate, 1,4-butanediol diglycidyl ether, 1,6-hexanediol diglycidyl ether, glycerin triglycidyl ether, trimethylolpropane triglycidyl ether, polyethylene glycol) diglycidyl ether, poly(propylene glycol) diglycidyl ether, 1,1,3-tetradecadiene dioxide, limonene dioxide, 1,2,7,8-diepoxyoctane, and 1,2,5,6-diepoxycyclooctane.

Examples of a compound having one oxetanyl group include, but are not limited to, 3-ethyl-3-hydroxymethyloxetane, 3-(meta)allyloxymethyl-3-ethyloxetane, (3-ethyl-3-oxetanylmethoxy)methylbenzene, 4-fluoro-[1-(3-ethyl-3-oxetanylmethoxy)methyl]benzene, 4-methoxy-[1-(3-ethyl-3-oxetanylmethoxy)methyl]benzene, [1-(3-ethyl-3-oxetanylmethoxy)ethyl] phenyl ether, isobutoxymethyl (3-ethyl-3-oxetanylmethyl) ether, isobornyloxyethyl (3-ethyl-3-oxetanylmethyl) ether, isobornyl (3-ethyl-3-oxetanylmethyl) ether, 2-ethylhexyl (3-ethyl-3-oxetanylmethyl) ether, ethyldiethylene glycol (3-ethyl-3-oxetanylmethyl) ether, dicyclopentadiene (3-ethyl-3-oxetanylmethyl) ether, dicyclopentenyloxyethyl (3-ethyl-3-oxetanylmethyl) ether, dicyclopentenyl (3-ethyl-3-oxetanylmethyl) ether, tetrahydrofurfuryl (3-ethyl-3-oxetanylmethyl) ether, tetrabromophenyl (3-ethyl-3-oxetanylmethyl) ether, 2-tetrabromophenoxyethyl (3-ethyl-3-oxetanylmethyl) ether, tribromophenyl (3-ethyl-3-oxetanylmethyl) ether, 2-tribromophenoxyethyl (3-ethyl-3-oxetanylmethyl) ether, 2-hydroxyethyl (3-ethyl-3-oxetanylmethyl) ether, 2-hydroxypropyl (3-ethyl-3-oxetanylmethyl) ether, butoxyethyl (3-ethyl-3-oxetanylmethyl) ether, pentachlorophenyl (3-ethyl-3-oxetanylmethyl) ether, pentabromophenyl (3-ethyl-3-oxetanylmethyl) ether, and bornyl (3-ethyl-3-oxetanylmethyl) ether.

Examples of a compound having at least two oxetanyl groups include, but are not limited to, polyfunctional oxetanes, such as 3,7-bis(3-oxetanyl)-5-oxa-nonane, 3,3'-(1,3-(2-methylenyl)propanediyl bis(oxymethylene))bis-(3-ethyl-oxetane), 1,4-bis[(3-ethyl-3-oxetanylmethoxy)methyl] benzene, 1,2-bis[(3-ethyl-3-oxetanylmethoxy)methyl] ethane, 1,3-bis[(3-ethyl-3-oxetanylmethoxy)methyl] propane, ethylene glycol bis(3-ethyl-3-oxetanylmethyl) ether, dicyclopentenyl bis(3-ethyl-3-oxetanylmethyl) ether, tri(ethylene glycol) bis(3-ethyl-3-oxetanylmethyl) ether, tetra(ethylene glycol) bis(3-ethyl-3-oxetanylmethyl) ether, tricyclodecanediyldimethylene (3-ethyl-3-oxetanylmethyl) ether, trimethylolpropane tris(3-ethyl-3-oxetanylmethyl) ether, 1,4-bis(3-ethyl-3-oxetanylmethoxy)butane, 1,6-bis(3-ethyl-3-oxetanylmethoxy)hexane, pentaerythritol tris(3-ethyl-3-oxetanylmethyl) ether, pentaerythritol tetrakis(3-ethyl-3-oxetanylmethyl) ether, polyethylene glycol) bis(3-ethyl-3-oxetanylmethyl) ether, dipentaerythritol hexakis(3-ethyl-3-oxetanylmethyl) ether, dipentaerythritol pentakis(3-ethyl-3-oxetanylmethyl) ether, dipentaerythritol tetrakis(3-ethyl-3-oxetanylmethyl) ether, caprolactone-modified dipentaerythritol hexakis(3-ethyl-3-oxetanylmethyl) ether, caprolactone-modified dipentaerythritol pentakis(3-ethyl-3-oxetanylmethyl) ether, ditrimethylolpropane tetrakis(3-ethyl-3-oxetanylmethyl) ether, EO-modified bisphenol A bis(3-ethyl-3-oxetanylmethyl) ether, PO-modified bisphenol A bis(3-ethyl-3-oxetanylmethyl) ether, EO-modified hydrogenated bisphenol A bis(3-ethyl-3-oxetanylmethyl) ether, PO-modified hydrogenated bisphenol A bis(3-ethyl-3-oxetanylmethyl) ether, and EO-modified bisphenol F (3-ethyl-3-oxetanylmethyl) ether.

These cation-polymerizable monomers may be used alone or in combination. EO denotes ethylene oxide, and an EO-modified compound has a block structure of an ethylene oxide group. PO denotes propylene oxide, and a PO-modified compound has a block structure of a propylene oxide group. The term "hydrogenated", as used herein, refers to the addition of hydrogen atoms to a C=C double bond, for example, of a benzene ring.

Polymerization Initiator (B)

When the polymerizable monomer (A) is a radical-polymerizable monomer, the polymerization initiator (B) generates a radical by the action of light (infrared rays, visible light, ultraviolet light, far-ultraviolet light, X-rays, charged particle beams, such as an electron beam, or radioactive rays). When the polymerizable monomer (A) is a cation-polymerizable monomer, the polymerization initiator (B) generates an acid by the action of light.

Examples of the radical generator include, but are not limited to, optionally substituted 2,4,5-triarylimidazole dimers, such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, and 2-(o- or p-methoxyphenyl)-4,5-diphenylimidazole dimer;

benzophenone and benzophenone derivatives, such as N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone;

aromatic ketone derivatives, such as 2-benzyl-2-dimethylamino-1-(4-morpholinophenyl)-butanone-1,2-methyl-1-[4-(methylthio)phenyl]-2-morpholino-propanon-1-one;

quinones, such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthrenequinone, 2-methyl-1,4-naphthoquinone, and 2,3-dimethylanthraquinone;

benzoin ether derivatives, such as benzoin methyl ether, benzoin ethyl ether, and benzoin phenyl ether;

benzoin and benzoin derivatives, such as methylbenzoin, ethylbenzoin, and propylbenzoin;

benzyl derivatives, such as benzyl dimethyl ketal;

acridine derivatives, such as 9-phenylacridine and 1,7-bis (9,9'-acridinyl)heptane;

N-phenylglycine and N-phenylglycine derivatives;

acetophenone and acetophenone derivatives, such as 3-methylacetophenone, acetophenone benzyl ketal, 1-hydroxycyclohexyl phenyl ketone, and 2,2-dimethoxy-2-phenylacetophenone;

thioxanthone and thioxanthone derivatives, such as diethylthioxanthone, 2-isopropylthioxanthone, and 2-chlorothioxanthone;

xanthone, fluorenone, benzaldehyde, fluorene, anthraquinone, triphenylamine, carbazole, 1-(4-isopropylphenyl)-2-hydroxy-2-methylpropan-1-one, and 2-hydroxy-2-methyl-1-phenylpropan-1-one; and 2,4,6-trimethylbenzoyldiphenylphosphine oxide, and bis-(2,6-dimethoxybenzoyl)-2,4,4-trimethylpentylphosphine oxide. These radical generators may be used alone or in combination.

The photo-induced radical generator may be, but is not limited to, the following product: Irgacure 184, 369, 651, 500, 819, 907, 784, 2959, CGI-1700, -1750, or -1850, or CG24-61, or Darocur 1116 or 1173 (manufactured by Ciba Japan K.K.), Lucirin TPO, LR8893, or LR8970 (manufactured by BASF), or Ebecryl P36 (manufactured by UCB).

Examples of a compound used as a polymerization initiator that produces an acid by the action of light include, but are not limited to, onium salt compounds, sulfone compounds, sulfonate ester compounds, sulfonimide compounds, and diazomethane compounds.

Examples of the onium salt compounds include, but are not limited to, iodonium salts, sulfonium salts, phosphonium salts, diazonium salts, ammonium salts, and pyridinium salts. Specific examples of the onium salt compounds include, but are not limited to, bis(4-t-butylphenyl)iodonium perfluoro-n-butane sulfonate, bis(4-t-butylphenyl)iodonium trifluoromethane sulfonate, bis(4-t-butylphenyl)iodonium 2-trifluoromethylbenzene sulfonate, bis(4-t-butylphenyl)iodonium pyrene sulfonate, bis(4-t-butylphenyl)iodonium n-dodecylbenzene sulfonate, bis(4-t-butylphenyl)iodonium p-toluene sulfonate, bis(4-t-butylphenyl)iodonium benzene sulfonate, bis(4-t-butylphenyl)iodonium 10-camphorsulfonate, bis(4-t-butylphenyl)iodonium n-octane sulfonate, diphenyliodonium perfluoro-n-butane sulfonate, diphenyliodonium trifluoromethane sulfonate, diphenyliodonium 2-trifluoromethylbenzene sulfonate, diphenyliodonium pyrene sulfonate, diphenyliodonium n-dodecylbenzene sulfonate, diphenyliodonium p-toluene sulfonate, diphenyliodonium benzene sulfonate, diphenyliodonium 10-camphorsulfonate, diphenyliodonium n-octane sulfonate, triphenylsulfonium perfluoro-n-butane sulfonate, triphenylsulfonium trifluoromethane sulfonate, triphenylsulfonium 2-trifluoromethylbenzene sulfonate, triphenylsulfonium pyrene sulfonate, triphenylsulfonium n-dodecylbenzene sulfonate, triphenylsulfonium p-toluene sulfonate, triphenylsulfonium benzene sulfonate, triphenylsulfonium 10-camphorsulfonate, triphenylsulfonium n-octane sulfonate, diphenyl(4-t-butylphenyl)sulfonium perfluoro-n-butane sulfonate, diphenyl(4-t-butylphenyl)sulfonium trifluoromethane sulfonate, diphenyl(4-t-butylphenyl)sulfonium 2-trifluoromethylbenzene sulfonate, diphenyl(4-t-butylphenyl)sulfonium pyrene sulfonate, diphenyl(4-t-butylphenyl)sulfonium n-dodecylbenzene sulfonate, diphenyl(4-t-butylphenyl)sulfonium p-toluene sulfonate, diphenyl(4-t-butylphenyl)sulfonium benzene sulfonate, diphenyl(4-t-butylphenyl)sulfonium 10-camphorsulfonate, diphenyl(4-t-butylphenyl)sulfonium n-octane sulfonate, tris(4-methoxyphenyl)sulfonium perfluoro-n-butane sulfonate, tris(4-methoxyphenyl)sulfonium trifluoromethane sulfonate, tris(4-methoxyphenyl)sulfonium 2-trifluoromethylbenzene sulfonate, tris(4-methoxyphenyl)sulfonium pyrene sulfonate, tris(4-methoxyphenyl)sulfonium n-dodecylbenzene sulfonate, tris(4-methoxyphenyl)sulfonium p-toluene sulfonate, tris(4-methoxyphenyl)sulfonium benzene sulfonate, tris(4-methoxyphenyl)sulfonium 10-camphorsulfonate, and tris(4-methoxyphenyl)sulfonium n-octane sulfonate.

Examples of the sulfone compounds include, but are not limited to, β-ketosulfones, β-sulfonylsulfones, and α-diazo compounds thereof. Specific examples of the sulfone compounds include, but are not limited to, phenacyl phenyl sulfone, mesityl phenacyl sulfone, bis(phenylsulfonyl)methane, and 4-trisphenacyl sulfone.

Examples of the sulfonate ester compounds include, but are not limited to, alkyl sulfonate esters, haloalkyl sulfonate esters, aryl sulfonate esters, and iminosulfonates. Specific examples of the sulfonate ester compounds include, but are not limited to, α-methylolbenzoin perfluoro-n-butane sulfonate, α-methylolbenzoin trifluoromethane sulfonate, and α-methylolbenzoin 2-trifluoromethylbenzene sulfonate.

Specific example of the sulfonimide compounds include, but are not limited to, N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hept-5-ene-2,3-dicarboxyimide, N-(trifluoromethylsulfonyloxy)-7-oxabicyclo[2.2.1]hept-5-ene-2,3-dicarboxyimide, N-(trifluoromethylsulfonyloxy)bicyclo[2.2.1]heptan-5,6-oxy-2,3-dicarboxyimide, N-(trifluoromethylsulfonyloxy)naphthylimide, N-(10-camphorsulfonyloxy)succinimide, N-(10-camphorsulfonyloxy)phthalimide, N-(10-camphorsulfonyloxy)diphenylmaleimide, N-(10-camphorsulfonyloxy)bicyclo[2.2.1]hept-5-ene-2,3-dicarboxyimide, N-(10-camphorsulfonyloxy)-7-oxabicyclo[2.2.1]hept-5-ene-2,3-dicarboxyimide, N-(10-camphorsulfonyloxy)bicyclo[2.2.1]heptan-5,6-oxy-2,3-dicarboxyimide, N-(10-camphorsulfonyloxy)naphthylimide, N-(4-methylphenylsulfonyloxy)succinimide, N-(4-methylphenylsulfonyloxy)phthalimide, N-(4-methylphenylsulfonyloxy)diphenylmaleimide, N-(4-methylphenylsulfonyloxy)bicyclo[2.2.1]hept-5-ene-2,3-dicarboxyimide, N-(4-methylphenylsulfonyloxy)-7-oxabicyclo[2.2.1]hept-5-ene-2,3-dicarboxyimide, N-(4-methylphenylsulfonyloxy)bicyclo[2.2.1]heptan-5,6-oxy-2,3-dicarboxyimide, N-(4-methylphenylsulfonyloxy)naphthylimide, N-(2-trifluoromethylphenylsulfonyloxy)succinimide, N-(2-trifluoromethylphenylsulfonyloxy)phthalimide, N-(2-trifluoromethylphenylsulfonyloxy)diphenylmaleimide, N-(2-trifluoromethylphenylsulfonyloxy)bicyclo[2.2.1]hept-5-ene-2,3-dicarboxyimide, N-(2-trifluoromethylphenylsulfonyloxy)-7-oxabicyclo[2.2.1]hept-5-ene-2,3-dicarboxyimide, N-(2-trifluoromethylphenylsulfonyloxy)bicyclo[2.2.1]heptan-5,6-oxy-2,3-dicarboxyimide, N-(2-trifluoromethylphenylsulfonyloxy)naphthylimide, N-(4-fluorophenylsulfonyloxy)succinimide, N-(4-fluorophenyl)phthalimide, N-(4-fluorophenylsulfonyloxy)diphenylmaleimide, N-(4-fluorophenylsulfonyloxy)bicyclo[2.2.1]hept-5-ene-2,3-dicarboxyimide, N-(4-fluorophenylsulfonyloxy)-7-oxabicyclo[2.2.1]hept-5-ene-2,3-dicarboxyimide, N-(4-fluorophenylsulfonyloxy)bicyclo[2.2.1]heptan-5,6-oxy-2,3-dicarboxyimide, and N-(4-fluorophenylsulfonyloxy)naphthylimide.

Specific examples of the diazomethane compounds include, but are not limited to, bis(trifluoromethylsulfonyl)diazomethane, bis(cyclohexylsulfonyl)diazomethane, bis(phenylsulfonyl)diazomethane, bis(p-toluenesulfonyl)diazomethane, methylsulfonyl p-toluenesulfonyldiazomethane, (cyclohexylsulfonyl) (1,1-dimethylethylsulfonyl)diazomethane, and bis(1,1-dimethylethylsulfonyl)diazomethane.

These acid generators may be used alone or in combination.

The polymerization initiator (B) component constitutes 0.01% by weight or more and 10% by weight or less, preferably 0.1% by weight or more and 7% by weight or less, of the amount of polymerizable monomer (A). Less than 0.01% by weight may result in a decreased curing rate and low reaction efficiency. On the other hand, more than 10% by weight may result in poor mechanical characteristics of a cured product of the photo-curable composition.

Other Additive Components

In addition to the polymerizable monomer (A), the polymerization initiator (B), and the fluorine-containing surfactant (C), a photo-curable composition according to an embodiment of the present invention may contain other additive components, such as a sensitizer, an antioxidant, a solvent, and/or a polymer component, for each purpose without losing the advantages of the present invention.

The sensitizer can promote polymerization reaction and improve reaction conversion. The sensitizer may be a hydrogen donor or a sensitizing dye.

The hydrogen donor can react with an initiator radical generated from the polymerization initiator (B) or a propagating radical to form a more reactive radical. The hydrogen donor can be added when the polymerization initiator (B) is a photo-induced radical generator.

Specific examples of the hydrogen donor include, but are not limited to, amine compounds, such as N-butylamine, di-n-butylamine, tri-n-butylphosphine, allylthiourea, s-benzylisothiuronium-p-toluene sulfinate, triethylamine, dimethylaminoethyl methacrylate, triethylenetetramine, 4,4'-bis(dialkylamino)benzophenone, ethyl N,N-dimethylaminobenzoate, isoamyl N,N-dimethylaminobenzoate, pentyl-4-dimethylaminobenzoate, triethanolamine, and N-phenylglycine; and mercapto compounds, such as 2-mercapto-N-phenylbenzoimidazole and mercaptopropionate.

The sensitizing dye is excited by absorbing light having a particular wavelength and acts on the polymerization initiator (B). The term "act on", as used herein, refers to energy transfer or electron transfer from the excited sensitizing dye to the polymerization initiator (B).

Specific examples of the sensitizing dye include, but are not limited to, anthracene derivatives, anthraquinone derivatives, pyrene derivatives, perylene derivatives, carbazole derivatives, benzophenone derivatives, thioxanthone derivatives, xanthone derivatives, thioxanthone derivatives, coumarin derivatives, phenothiazine derivatives, camphorquinone derivatives, acridine dyes, thiopyrylium salt dyes, merocyanine dyes, quinoline dyes, styrylquinoline dyes, ketocoumarin dyes, thioxanthene dyes, xanthene dyes, oxonol dyes, cyanine dyes, rhodamine dyes, and pyrylium salt dyes.

The sensitizer may be used alone or in combination.

The sensitizer in a photo-curable composition according to an embodiment of the present invention preferably constitutes 0% to 20% by weight, more preferably 0.1% by weight to 5.0% by weight, still more preferably 0.2% by weight to 2.0% by weight, of the amount of polymerizable monomer (A). When the sensitizer content is 0.1% by weight or more, the effects of the sensitizer can be more effectively produced. When the sensitizer content is 5.0% by weight or less, a photo-cured product can have a sufficiently high molecular weight, and deterioration in solubility or storage stability can be prevented.

Temperature of Photo-Curable Composition in Blending

A photo-curable composition may be mixed and dissolved at a temperature in the range of 0° C. to 100° C.

Viscosity of Photo-Curable Composition

A photo-curable composition according to an embodiment of the present invention preferably has a viscosity in the range of 1 to 100 cP, more preferably 5 to 50 cP, still more preferably 6 to 20 cP, at 23° C. in the absence of solvent. A viscosity of more than 100 cP may result in a long filling time of the composition in a micropatterned depressed portion on a mold or patterning defects because of insufficient filling in a stamping step described below. A viscosity of less than 1 cP may result in uneven coating in a coating step described below or the outflow of the composition from a mold in the stamping step described below.

Surface Tension of Photo-Curable Composition

A photo-curable composition according to an embodiment of the present invention preferably has a surface tension in the range of 5 to 70 mN/m, more preferably 7 to 35 mN/m, still more preferably 10 to 32 mN/m, at 23° C. in the absence of solvent.

A surface tension of less than 5 mN/m results in a long filling time of the composition in recessed and raised portions on a mold in a contact step described below. A surface tension of more than 70 mN/m results in poor surface smoothness.

Particulate Contaminant in Photo-Curable Composition

In order to prevent defects in recessed and raised portions of a cured product of the polymerizable monomer (A) caused by particulate contaminants, after the components are mixed, a photo-curable composition may be passed through a filter having a pore size in the range of 0.001 to 5.0 μm. The filtration may be performed in multiple steps or multiple times. A filtered liquid may be filtered again. The material of the filter may be, but is not limited to, polyethylene resin, polypropylene resin, fluoropolymer, or nylon resin.

Metal Impurities in Photo-Curable Composition

Metal impurities in a photo-curable composition for use in the manufacture of semiconductor integrated circuits are minimized so as not to inhibit the operation of the circuits. Thus, the concentration of metal impurities in a photo-curable composition according to an embodiment of the present invention is preferably 10 ppm or less, more preferably 100 ppb or less.

Patterning Method

Figure 1B:
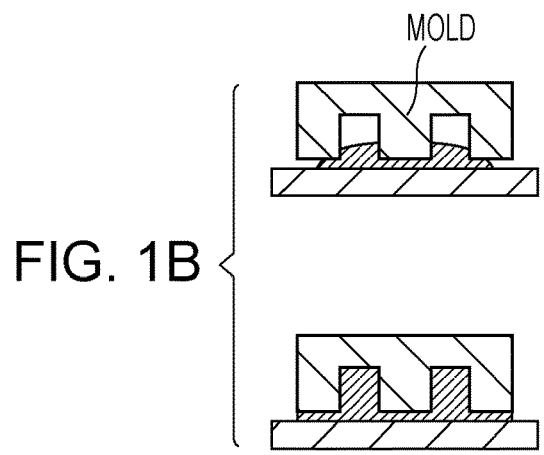
Figure 1C:
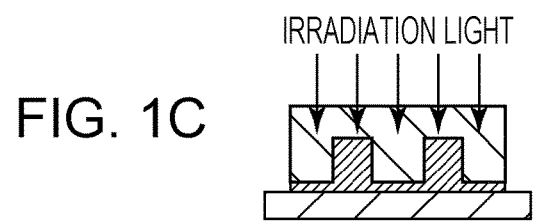
Figure 1D:
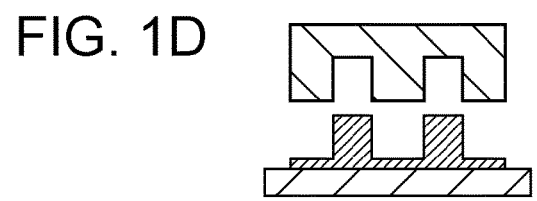

A patterning method according to an embodiment of the present invention involves a placing step of placing a photo-curable composition on a substrate to be processed (FIG. 1A), a mold contact step of bringing the photo-curable composition into contact with a mold (FIG. 1B), a photoirradiation step of irradiating the photo-curable composition with light while the photo-curable composition is in contact with the mold (FIG. 1C), and a demolding step of releasing the photo-curable composition from the mold (FIG. 1D).

In the photoirradiation step, the photo-curable composition may be irradiated with light through the mold.

Figure 1E:
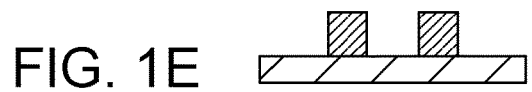

The method may further involve an exposure step of etching part of a film of the photo-curable composition remaining in depressed portions after the demolding step to expose a surface of the substrate in the depressed portions (FIG. 1E).

Each of the steps of a patterning method according to the present invention will be described below.

Placing Step (FIG. 1A)

In the present embodiment, the placing step of placing a photo-curable composition on a substrate to be processed is a coating step. A photo-curable composition according to an embodiment of the present invention is applied to a substrate to be processed.

The substrate to be processed may be a substrate, such as a silicon wafer. The substrate to be processed may also be a substrate for semiconductor devices made of aluminum, a titanium-tungsten alloy, an aluminum-silicon alloy, an aluminum-copper-silicon alloy, silicon oxide, or silicon nitride. The substrate to be processed may be a substrate subjected to surface treatment, such as silane coupling treatment, silazane treatment, or the formation of an organic film, to improve adhesion to the photo-curable composition.

The photo-curable composition may be applied by an ink jet method, a dip coating method, an air knife coating method, a curtain coating method, a wire bar coating method, a gravure coating method, an extrusion coating method, a spin coating method, or a slit scanning method. The film thickness of the photo-curable composition depends on the application and is in the range of 0.01 to 100.0 μm, for example.

Mold Contact Step (FIG. 1B)

In the mold contact step of bringing the photo-curable composition into contact with a mold, recessed and raised portions (micropattern) on a surface of the mold are filled with the photo-curable composition.

The mold is made of an optically transparent material, for example, glass, quartz, an optically transparent resin, such as PMMA or polycarbonate resin, a transparent metallized film, a soft film, such as a polydimethylsiloxane film, a photo-cured film, or a metal film.

A surface of the mold in contact with the photo-curable composition may be hydrophilic so as to facilitate the formation of a polar bond with the fluorine-containing surfactant (C).

A mold for use in a patterning method according to an embodiment of the present invention may be subjected to surface treatment so as to improve the releasability of a photo-curable composition from the mold. The surface treatment may involve the use of a silane coupling agent, such as a silicone or fluorinated coupling agent, for example, a commercially available coating-type mold-release agent, such as Optool DSX manufactured by Daikin Industries, Ltd.

The contact pressure is generally, but not limited to, in the range of 0.1 Pa to 100 MPa, preferably 0.1 Pa to 50 MPa, more preferably 0.1 Pa to 30 MPa, still more preferably 0.1 Pa to 20 MPa. The contact time is generally, but not limited to, in the range of 1 to 600 seconds, preferably 1 to 300 seconds, more preferably 1 to 180 seconds, still more preferably 1 to 120 seconds.

A patterning method according to an embodiment of the present invention may be performed in the atmosphere, under reduced pressure, or in an inert gas atmosphere. Specific examples of inert gas include, but are not limited to, nitrogen, carbon dioxide, helium, argon, various chlorofluorocarbons, and mixtures thereof. The pressure may be in the range of 0.0001 to 10 atm. Use of reduced pressure or an inert gas atmosphere can eliminate the effects of oxygen or water on the photo-curing reaction. Photoirradiation step (FIG. 1C)

In the photoirradiation step, the photo-curable composition is irradiated with light while the photo-curable composition is in contact with the mold. In this step, the photo-curable composition in recessed and raised portions on the mold surface is cured.

The light is not particularly limited, depends on the sensitive wavelength of a photo-curable composition according to an embodiment of the present invention, and may be ultraviolet light having a wavelength in the range of approximately 150 to 400 nm, X-rays, or an electron beam Various photosensitive compounds sensitive to ultraviolet light are easily available as the polymerization initiator (B). Examples of ultraviolet light sources include, but are not limited to, high-pressure mercury lamps, ultrahigh-pressure mercury lamps, low-pressure mercury lamps, deep-UV lamps, carbon arc lamps, chemical lamps, metal halide lamps, xenon lamps, KrF excimer lasers, ArF excimer lasers, and $F_2$ excimer lasers. These light sources may be used alone or in combination. The photo-curable composition may be entirely or partly irradiated with light.

If possible, the photo-curable composition may further be cured with heat. The heating atmosphere and the heating temperature of heat curing are not particularly limited and may be an inert atmosphere or under reduced pressure and in the range of 40° C. to 200° C. Heating may be performed with a hot plate, an oven, or a furnace.

Demolding Step (FIG. 1D)

In the demolding step, the photo-curable composition is removed from the mold. In this step, the reverse pattern of the recessed and raised portions on the mold surface is transferred to a cured product of the photo-curable composition.

The demolding method is not particularly limited, and various conditions are also not particularly limited. For example, a substrate to be processed may be fixed while a mold may be moved away from the substrate to be processed, or a mold may be fixed while a substrate to be processed may be moved away from the mold, or a substrate to be processed and a mold may be moved in the opposite directions.

A patterning method according to an embodiment of the present invention may involve the use of a coating-type mold-release agent. More specifically, a coating-type mold-release agent layer may be formed on a patterned surface of a mold before the stamping step.

Examples of the coating-type mold-release agent include, but are not limited to, silicon mold-release agents, fluorinated mold-release agents, polyethylene mold-release agents, polypropylene mold-release agents, paraffinic mold-release agents, montan mold-release agents, and carnauba mold-release agents. The mold-release agent may be used alone or in combination.

Exposure Step (FIG. 1E)

In the exposure step, part of a film of the photo-curable composition remaining in depressed portions is etched to expose a surface of the substrate in the depressed portions.

The etching method is not particularly limited and may be a conventional method, such as dry etching. A known dry etching apparatus may be used in dry etching. The source gas for dry etching depends on the elementary composition of a film to be etched and may be an oxygen-containing gas, such as $O_2$, CO, or $CO_2$, an inert gas, such as He, $N_2$, or Ar, a chlorine gas, such as $Cl_2$ or $BCl_3$, $H_2$, or $NH_3$. These source gases may be used alone or in combination.

Figure 1F:

Substrate Processing Step (FIG. 1F)

A pattern formed in the exposure step can be used as a film for an interlayer insulating film of a semiconductor element, such as LSI, system LSI, DRAM, SDRAM, RDRAM, or D-RDRAM, or a resist film in the manufacture of a semiconductor element.

More specifically, as illustrated in FIG. 1F, the exposed portions in the exposure step may be subjected to etching or ion implantation to form a circuit structure based on the photo-curable composition pattern on the substrate to be processed. A circuit board for a semiconductor element can be manufactured through these steps.

The photo-curable composition pattern may be removed from the substrate or may be left as a member for constituting the element.

The substrate may be used as an optical element having a textured pattern on its surface. More specifically, the substrate may be provided as an article that includes a substrate and a cured product of the photo-curable composition on the substrate.

EXAMPLES

The present invention will be further described in the following examples. However, the technical scope of the present invention is not limited to these examples. Unless otherwise specified, "part" and "%" are based on weight.

Synthesis Example 1

Synthesis of Fluorine-Containing Surfactant (C-1)

A 300-mL reactor was charged with hexa(ethylene glycol) (PEG6) (26.5 g, 93.9 mmol, 1.0 eq.), carbon tetrachloride ($CCl_4$) (36.1 g, 235 mmol, 2.5 eq.), and tetrahydrofuran (THF) (106 mL) in a nitrogen atmosphere and was cooled to −30° C. To this solution was slowly added dimethylaminophosphine (15.3 g, 93.9 mmol, 1.0 eq.) diluted with THF (24 mL) for two hours. After stirring for 30 minutes at that temperature, a cooling bath was removed, and the solution was stirred at room temperature for two hours. To this pale yellow suspension was added city water (250 mL) to separate the suspension into two layers ($CCl_4$ and aqueous layer). The aqueous layer was washed with isopropyl ether (IPE) (150 mL×2). Potassium hexafluorophosphate ($KPF_6$) (34.5 g, 188 mmol, 2.0 eq.) dispersed in city water (250 mL) in this solution was added to the aqueous layer and was sufficiently stirred. An organic layer extracted with dichloromethane (200 mL×3) was washed with city water (400 mL) and saturated saline (300 mL) and was dried over anhydrous magnesium sulfate. The solution was concentrated to yield a light brown liquid (C-1-a) (53 g).

A 500-mL reactor was charged with 1H,1H-perfluoro-1-heptanol (34.2 g, 97.7 mmol, 1.2 eq.) and THF (120 mL). To this solution was slowly added NaH (60%) (3.9 g, 97.7 mmol, 1.2 eq.) with attention to foaming. After stirring at 50° C. for one hour, the solvent was evaporated under reduced pressure. The liquid (C-1-a) (53 g) dissolved in anhydrous dioxane (600 mL) was added to the residue and was stirred at 60° C. for 48 hours. The suspension was concentrated, and city water (300 mL) and ethyl acetate (300 mL) were added to the resulting residue to separate the residue into two layers. An aqueous layer was extracted with ethyl acetate (200 mL×2). An organic layer was washed with city water (400 mL) and saturated saline (400 mL) and was dried over anhydrous magnesium sulfate. The solution was concentrated to yield a brown liquid (59.1 g). The brown liquid was subjected to column purification ($SiO_2$:1.2 kg, ethyl acetate alone=>ethyl acetate/methanol=10/1) and then column purification ($SiO_2$:400 g, chloroform/methanol=15/1=>10/1) and was dried under high vacuum to yield a fluorine-containing surfactant (C-1), hexa(ethylene glycol) mono-1H,1H-perfluoroheptyl ether ($F(CF_2)_6CH_2(OCH_2CH_2)_6OH$, 19.2 g, 31.2 mmol, yield 33%), as a colorless liquid.

Example 1

A mixed solution was prepared by using 100 parts by weight of 1,6-hexanediol diacrylate (manufactured by Osaka Organic Chemical Industry Ltd.) as the (A) component, 3 parts by weight of Irgacure 369 (manufactured by Ciba Japan K.K.) as the (B) component, and 0.125 parts by weight of the fluorine-containing surfactant (C-1) as the (C) component. The mixed solution was passed through a 0.2 μm tetrafluoroethylene filter to yield a photo-curable composition (a-1) according to Example 1.

The surface tension of the photo-curable composition (a-1) was 31.5 mN/m as measured with an automatic surface tensiometer CBVP-A3 (manufactured by Kyowa Interface Science Co., Ltd.).

The viscosity of the photo-curable composition (a-1) was 6.4 cP as measured with a cone-and-plate viscometer RE-85L (manufactured by Toki Sangyo Co., Ltd.).

Measurement of Water Contact Angle

A film of the photo-curable composition (a-1) having a thickness of approximately 1 μm was formed on a silicon wafer by a spin coating method.

A photo-cured film was prepared by irradiating the film of the photo-curable composition (a-1) with light from a UV light source EX250 (manufactured by Hoya Candeo Optronics Corp.) equipped with a 250-W ultrahigh-pressure mercury lamp in a nitrogen atmosphere through an interference filter VPF-50C-10-25-36500 (manufactured by Sigmakoki Co., Ltd.). The illuminance on the film was 25 mW/$cm^2$ at a wavelength of 365 nm. The photoirradiation time was 100 seconds.

The contact angle of 1 μl of pure water on the photo-cured film of the photo-curable composition (a-1) was 69 degrees as measured with a fully-automatic contact angle meter CA-W (manufactured by Kyowa Interface Science Co., Ltd.).

Measurement of Demolding Force

15 μl of (a-1) was dropped with a micropipette on a 4-inch silicon wafer that has an adhesion-promoting layer having a thickness of 60 nm as an adhesion layer.

A 40×40 mm quartz mold having no surface treatment and no pattern was stamped onto the silicon wafer.

An UV light source EXECURE 3000 (manufactured by Hoya Candeo Optronics Corp.) equipped with a 200-W mercury xenon lamp was used as an irradiation light source. An interference filter VPF-50C-10-25-36500 (manufactured by Sigmakoki Co., Ltd.) was placed between the light source and the quartz mold. The illuminance directly under the quartz mold was 1 mW/$cm^2$ at a wavelength of 365 nm.

Under these conditions, the photoirradiation step was performed for 60 seconds.

In the demolding step, the quart mold was raised at 0.5 mm/s.

The demolding force was measured with a compact tension/compression load cell LUR-A-200NSA1 (manufactured by Kyowa Electronic Instruments Co., Ltd.). The average demolding force of four measurements under the same conditions was 149 N.

Example 2

A photo-curable composition (a-2) was prepared in the same manner as in Example 1 except that 0.5 parts by weight of the fluorine-containing surfactant (C-1) was used as the (C) component.

The surface tension and the viscosity of the photo-curable composition (a-2) were 25.5 mN/m and 6.4 cP, respectively, as measured in the same manner as in Example 1.

Measurement of Water Contact Angle

A photo-cured film of the photo-curable composition (a-2) prepared in the same manner as in Example 1 had a water contact angle of 64 degrees.

Measurement of Demolding Force

The average demolding force of the photo-curable composition (a-2) was 128 N as measured in the same manner as in Example 1.

Example 3

A photo-curable composition (a-3) was prepared in the same manner as in Example 1 except that 2.0 parts by weight of the fluorine-containing surfactant (C-1) was used as the (C) component.

The surface tension and the viscosity of the photo-curable composition (a-3) were 21.0 mN/m and 6.5 cP, respectively, as measured in the same manner as in Example 1.

Measurement of Water Contact Angle

A photo-cured film of the photo-curable composition (a-3) prepared in the same manner as in Example 1 had a water contact angle of 29 degrees.

Measurement of Demolding Force

The average demolding force of the photo-curable composition (a-3) was 88 N as measured in the same manner as in Example 1.

Example 4

A mixed solution was prepared from the (A) component: 61.6 parts by weight of isobornyl acrylate (IB-XA manufactured by Kyoeisha Chemical Co., Ltd.), 10 parts by weight of (2-methyl-2-ethyl-1,3-dioxolan-4-yl)methyl acrylate (MEDOL-10 manufactured by Osaka Organic Chemical Industry Ltd.), and 22.4 parts by weight of hexanediol diacrylate (Viscoat #230 manufactured by Osaka Organic Chemical Industry Ltd.), the (B) component: 3 parts by weight of Irgacure 369 (manufactured by Ciba Japan K.K.), and the (C) component: 2.2 parts by weight of pentadeca (ethylene glycol) mono-1H,1H,2H,2H-perfluorooctyl ether $(F(CF_2)_6CH_2CH_2(OCH_2CH_2)_{15}OH$, manufactured by DIC). The mixed solution was passed through a 0.2 µm tetrafluoroethylene filter to yield a photo-curable composition (a-4) according to Example 4.

The surface tension and the viscosity of the photo-curable composition (a-4) were 24.9 mN/m and 7.1 cP, respectively, as measured in the same manner as in Example 1.

Measurement of Water Contact Angle

A photo-cured film of the photo-curable composition (a-4) prepared in the same manner as in Example 1 had a water contact angle of 64 degrees.

Measurement of Demolding Force

The average demolding force of the photo-curable composition (a-4) was 99 N as measured in the same manner as in Example 1.

Example 5

A photo-curable composition (a-5) was prepared in the same manner as in Example 4 except that the (C) component was 1.3 parts by weight of eicosa(ethylene glycol) mono-1H,1H,2H,2H-perfluorooctyl ether $(F(CF_2)_6CH_2CH_2(OCH_2CH_2)_{20}OH$, manufactured by DIC).

The surface tension and the viscosity of the photo-curable composition (a-5) were 27.2 mN/m and 7.0 cP, respectively, as measured in the same manner as in Example 1.

Measurement of Water Contact Angle

A photo-cured film of the photo-curable composition (a-5) prepared in the same manner as in Example 1 had a water contact angle of 72 degrees.

Measurement of Demolding Force

The average demolding force of the photo-curable composition (a-5) was 118 N as measured in the same manner as in Example 1.

Example 6

A mixed solution was prepared from the (A) component: 61.6 parts by weight of isobornyl acrylate (IB-XA manufactured by Kyoeisha Chemical Co., Ltd.), 10 parts by weight of (2-methyl-2-ethyl-1,3-dioxolan-4-yl)methyl acrylate (MEDOL-10 manufactured by Osaka Organic Chemical Industry Ltd.), and 22.4 parts by weight of hexanediol diacrylate (Viscoat #230 manufactured by Osaka Organic Chemical Industry Ltd.), the (B) component: 3 parts by weight of 2,2-dimethoxy-2-phenylacetophenone (Irgacure 651 manufactured by BASF), and the (C) component: 1.1 parts by weight of pentadeca(ethylene glycol) mono-1H,1H,2H,2H-perfluorooctyl ether $(F(CF_2)_6CH_2CH_2(OCH_2CH_2)_{15}OH$, manufactured by DIC).

The mixed solution was passed through a 0.2 µm tetrafluoroethylene filter to yield a photo-curable composition (a-6) according to Example 6.

The surface tension and the viscosity of the photo-curable composition (a-6) were 26.1 mN/m and 6.6 cP, respectively, as measured in the same manner as in Example 1.

Measurement of Water Contact Angle

A photo-cured film of the photo-curable composition (a-6) prepared in the same manner as in Example 1 had a water contact angle of 58 degrees.

Measurement of Demolding Force

The light source was an ultrahigh-pressure mercury lamp. An interference filter was placed between the light source and a quartz mold. Light having a wavelength of 313±5 nm can selectively pass through the interference filter. The illuminance directly under the quartz mold was 38.5 mW/cm$^2$ at a wavelength of 313 nm.

1440 droplets of 11 pL of the photo-curable composition (a-6) were substantially uniformly dropped by an ink jet method on a 26×33 mm region of a 300-mm silicon wafer including an adhesion-promoting layer having a thickness of 3 nm as an adhesion layer.

A 26×33 mm quartz mold having no surface treatment and no pattern was brought into contact with the silicon wafer.

30 seconds after that, photoirradiation was performed for 5 seconds.

After the photoirradiation, the quartz mold was removed. The demolding force was measured with a load cell. The average demolding force of three measurements under the same conditions was 48.7 N. This demolding force was lower than that in Comparative Example 3 described below.

Example 7

A photo-curable composition (a-7) was prepared in the same manner as in Example 6 except that the (C) component was 2.2 parts by weight of pentadeca(ethylene glycol) mono-1H,1H,2H,2H-perfluorooctyl ether $(F(CF_2)_6CH_2CH_2(OCH_2CH_2)_{15}OH$, manufactured by DIC).

The surface tension and the viscosity of the photo-curable composition (a-7) were 23.9 mN/m and 6.7 cP, respectively, as measured in the same manner as in Example 1.

Measurement of Water Contact Angle

A photo-cured film of the photo-curable composition (a-7) prepared in the same manner as in Example 1 had a water contact angle of 9 degrees.

Measurement of Demolding Force

The average demolding force of the photo-curable composition (a-7) was 49.1 N as measured in the same manner as in Example 6. This demolding force was lower than that in Comparative Example 3 described below.

Example 8

A photo-curable composition (a-8) was prepared in the same manner as in Example 6 except that the (B) component was 3 parts by weight of 2-methyl-1-[4-(methylthio)phenyl]-2-morpholinopropan-1-one (Irgacure 907 manufactured by BASF).

The surface tension and the viscosity of the photo-curable composition (a-8) were 26.5 mN/m and 6.7 cP, respectively, as measured in the same manner as in Example 1.

Measurement of Water Contact Angle

A photo-cured film of the photo-curable composition (a-8) prepared in the same manner as in Example 1 had a water contact angle of 42 degrees.

Measurement of Demolding Force

The average demolding force of the photo-curable composition (a-8) was 55.3 N as measured in the same manner as in Example 6. This demolding force was lower than that in Comparative Example 3 described below.

Comparative Example 1

A photo-curable composition (b-1) was prepared in the same manner as in Example 1 except that no (C) component was added.

The surface tension and the viscosity of the photo-curable composition (b-1) were 35.9 mN/m and 6.3 cP, respectively, as measured in the same manner as in Example 1.

Measurement of Water Contact Angle

A photo-cured film of the photo-curable composition (b-1) prepared in the same manner as in Example 1 had a water contact angle of 79 degrees.

Measurement of Demolding Force

The average demolding force of the photo-curable composition (b-1) was 158 N as measured in the same manner as in Example 1, which was larger than Examples 1 to 3.

Comparative Example 2

A photo-curable composition (b-2) was prepared in the same manner as in Example 4 except that no (C) component was added.

The surface tension and the viscosity of the photo-curable composition (b-2) were 31.5 mN/m and 6.8 cP, respectively, as measured in the same manner as in Example 1.

Measurement of Water Contact Angle

A photo-cured film of the photo-curable composition (b-2) prepared in the same manner as in Example 1 had a water contact angle of 81 degrees.

Measurement of Demolding Force

The average demolding force of the photo-curable composition (b-2) was 143 N as measured in the same manner as in Example 1, which was larger than Examples 4 and 5.

Comparative Example 3

A photo-curable composition (b-3) was prepared in the same manner as in Example 6 except that no (C) component was added.

The surface tension and the viscosity of the photo-curable composition (b-3) were 28.1 mN/m and 6.4 cP, respectively, as measured in the same manner as in Example 1.

Measurement of Water Contact Angle

A photo-cured film of the photo-curable composition (b-3) prepared in the same manner as in Example 1 had a water contact angle of 94 degrees.

Measurement of Demolding Force

The average demolding force of the photo-curable composition (b-3) was 56.5 N as measured in the same manner as in Example 6, which was larger than Examples 6 to 8.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-246714, filed Nov. 10, 2011, which is hereby incorporated by reference herein in its entirety.

The invention claimed is:

1. A patterning method, comprising:
   placing a photo-curable composition on a substrate that has an adhesion layer; bringing the photo-curable composition into contact with a mold;
   irradiating the photo-curable composition with light; and
   releasing the photo-curable composition from the mold after the irradiation to form a pattern out of the photo-curable composition on the substrate to be processed,
   wherein the photo-curable composition contains at least a polymerizable monomer (A), a polymerization initiator (B) and a fluorine-containing surfactant (C),
   the photo-curable composition is arranged such that a photo-cured product of the photo-curable composition has a water contact angle of 74 degrees or less,
   the fluorine-containing surfactant (C) has a perfluoroalkyl chain (C-a) on one end,
   and a hydroxyl group (C-c) on the other end,
   the perfluoroalkyl chain is linked to the hydroxyl group through a poly(alkylene oxide) chain (C-b1).

2. The patterning method according to claim 1, wherein a surface of the mold in contact with the photo-curable composition is made of quartz.

3. The patterning method according to claim 1, wherein the irradiation involves irradiating the photo-curable composition with light through the mold having recessed and raised portions on its surface.

4. A method for manufacturing a circuit board, comprising:
   etching or implanting ions into a substrate in accordance with a pattern formed by the patterning method according to claim 1, thereby forming a circuit structure.

5. The patterning method according to claim 1,
   wherein the polymerization initiator (B), contained in the photo-curable composition, is 0.1% by weight or more and 7% by weight or less compared with the amount of polymerizable monomer (A),
   and the fluorine-containing surfactant (C), contained in the photo-curable composition, is 0.001% by weight to 5% by weight.

6. The patterning method according to claim 1,
   wherein the water contact angle of the photo-cured product of the photo-curable composition has a water contact angle of 64 degrees or less.

7. The patterning method according to claim 1,
   wherein a viscosity of photo-curable composition is 6 to 20 cP, at 23° C. in the absence of solvent.

8. The patterning method according to claim 1,
wherein the poly(alkylene oxide) chain (C-b1) is a polyethylene oxide chain which has 1 to 100 recurring units.

9. The patterning method according to claim 1,
wherein the fluorine-containing surfactant (C) is at least a kind of compound indicated by the following general formula (1):

$$F(CF_2)_6(CH_2)_m(OCH_2CH_2)_nOH \qquad (1),$$

(m is an integer in the range of 1 to 3, and n is an integer in the range of 1 to 100).

10. A patterning method, comprising:
placing a photo-curable composition on a substrate that has an adhesion layer;
bringing the photo-curable composition into contact with a mold;
irradiating the photo-curable composition with light; and
releasing the photo-curable composition from the mold after the irradiation to form a pattern out of the photo-curable composition on the substrate to be processed,
wherein the photo-curable composition contains at least a polymerizable monomer (A), a polymerization initiator (B) and a fluorine-containing surfactant (C),
a photo-cured product of the photo-curable composition has a water contact angle of 74 degrees or less,
the fluorine-containing surfactant (C) has a perfluoroalkyl chain (C-a) on one end, and a hydroxyl group (C-c) on the other end,
the perfluoroalkyl chain is linked to the hydroxyl group through a poly(alkylene oxide) chain (C-b1); and
wherein the polymerizable monomer has at least 1,6-hexanediol di(meth)acrylate, isobornyl acrylate and (2-methyl-2-ethyl-1,3-dioxolan-4-yl)methyl acrylate.

11. The patterning method according to claim 1,
wherein the polymerization initiator (B) is 2-methyl-1-[4-(methylthio)phenyl]-2-morpholinopropan-1-one, or 2,2-dimethoxy-2-phenylacetophenone.

12. The patterning method according to claim 1,
wherein the base material to be processed is Silicon oxide.

13. The patterning method according to claim 1,
wherein the number of carbon atoms of the perfluoroalkyl chain (C-a) is 7 or less.

14. The patterning method according to claim 1,
wherein the fluorine-containing surfactant consists of only fluorine-containing surfactants which consist of the number of carbon atoms of the perfluoroalkyl chain (C-a) is 7 or less.

15. A method for manufacturing a circuit board to form circuit structure on the substrate to be processed according to the patterning shape, the method comprising:
etching or implanting ions into a substrate in accordance with the pattern shape formed by the patterning method of claim 1.

16. The patterning method according to claim 1, wherein the adhesion layer is formed by silane coupling treatment, silazane treatment, or formation of an organic film.

* * * * *